(12) United States Patent
Beaman et al.

(10) Patent No.: US 7,651,910 B2
(45) Date of Patent: Jan. 26, 2010

(54) METHODS OF FORMING PROGRAMMABLE MEMORY DEVICES

(75) Inventors: Kevin L. Beaman, Boise, ID (US);
Ronald A. Weimer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 262 days.

(21) Appl. No.: 10/150,623

(22) Filed: May 17, 2002

(65) Prior Publication Data

US 2003/0216000 A1 Nov. 20, 2003

(51) Int. Cl.
*H01L 21/336* (2006.01)

(52) U.S. Cl. .................... 438/257; 257/E21.68

(58) Field of Classification Search ......... 438/257–267, 438/314–320, 573, 585, 587, 591, 758, 791; 257/309–320, E21.68, E21.681, E21.688, 257/E21.689
See application file for complete search history.

(56) References Cited

U.S. PATENT DOCUMENTS

| | | | |
|---|---|---|---|
| 4,852,062 A | | 7/1989 | Baker et al. |
| 5,429,971 A | * | 7/1995 | Yang ..................... 438/258 |
| 5,484,741 A | * | 1/1996 | Bergemont ............... 438/257 |
| 5,557,122 A | * | 9/1996 | Shrivastava et al. ........ 257/309 |
| 5,731,242 A | * | 3/1998 | Parat et al. ............... 438/586 |
| 5,968,611 A | * | 10/1999 | Kaloyeros et al. .......... 427/579 |
| 6,037,223 A | * | 3/2000 | Su et al. .................. 438/257 |
| 6,074,915 A | * | 6/2000 | Chen et al. ............... 438/258 |
| 6,133,096 A | * | 10/2000 | Su et al. .................. 438/264 |
| 6,146,946 A | | 11/2000 | Wang et al. |
| 6,177,311 B1 | * | 1/2001 | Kauffman et al. ........... 438/257 |
| 6,211,012 B1 | * | 4/2001 | Lee et al. ................. 438/257 |
| 6,284,583 B1 | * | 9/2001 | Saida et al. ............... 438/216 |
| 6,420,752 B1 | * | 7/2002 | Ngo et al. ................. 257/315 |
| 6,638,861 B1 | * | 10/2003 | Ngo et al. ................. 438/685 |

OTHER PUBLICATIONS

Tanaka, M. et al., "Realization of High Performance Dual Gate DRAMs Without Boron Penetration by Application of Tetrachlorosilane Silicon Nitride Films", 2001 Symposium on VLSI Technology Digest of Technical Papers, pp. 123-124.
Alexandrov et al., "A study of remote plasma enhanced CVD of silicon nitride films," Journal de Physicque IV, vol. 3, 1993, pp. 233-240.

* cited by examiner

*Primary Examiner*—Brook Kebede
(74) *Attorney, Agent, or Firm*—Wells St. John P.S.

(57) ABSTRACT

The invention includes a method of forming a programmable memory device. A tunnel oxide is formed to be supported by a semiconductor substrate. A stack is formed over the tunnel oxide. The stack comprises a floating gate, dielectric mass and control gate. The stack has a top, and has opposing sidewalls extending downwardly from the top. The dielectric mass includes silicon nitride. Silicon nitride spacers are formed along sidewalls of the stack, and a silicon nitride cap is formed over a top of the stack. The silicon nitride within the dielectric mass, cap and/or sidewall spacers is formed from trichlorosilane and ammonia.

24 Claims, 2 Drawing Sheets

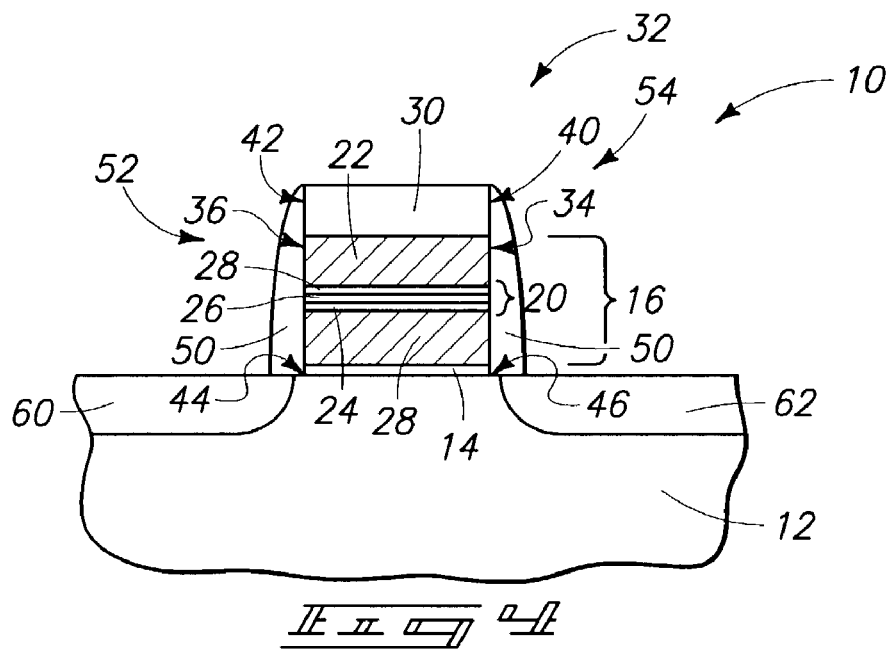
_Fig. 4_
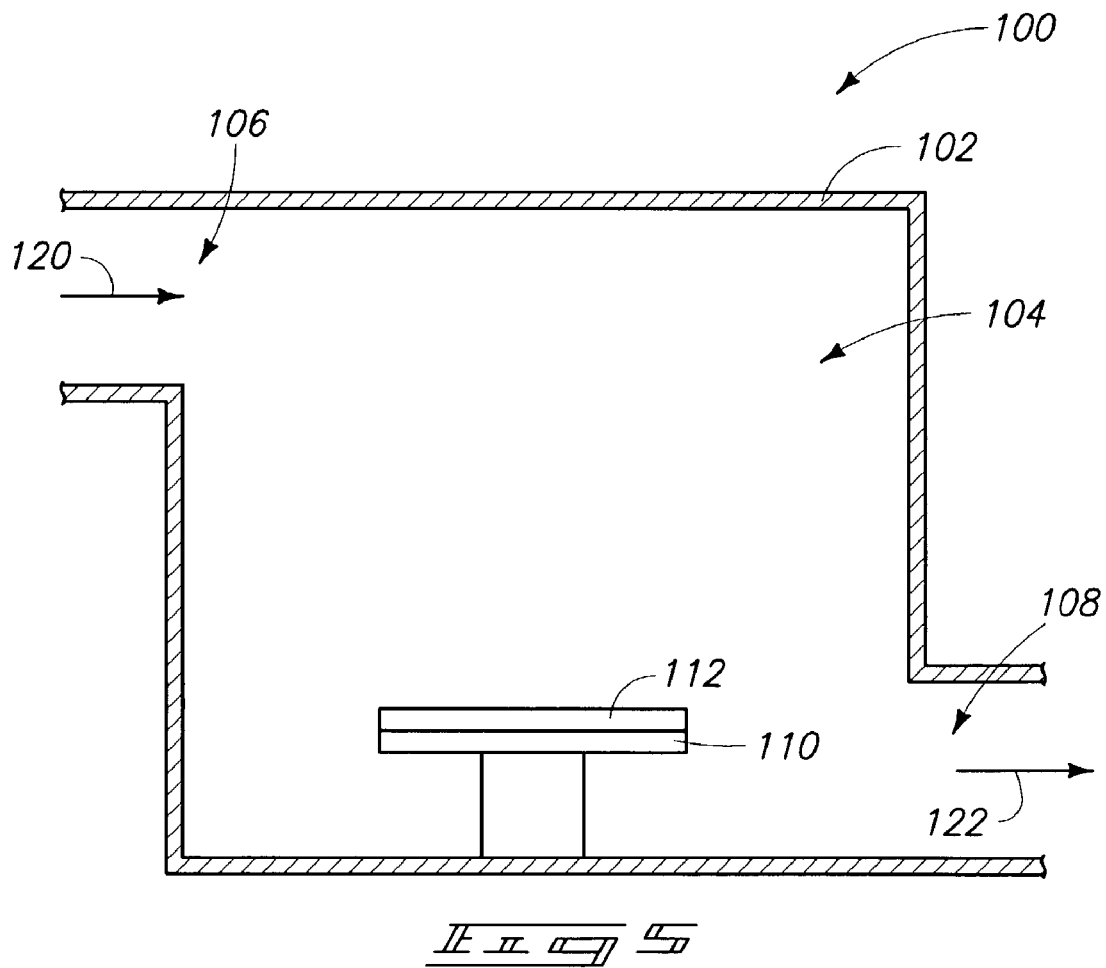
_Fig. 5_

US 7,651,910 B2

METHODS OF FORMING PROGRAMMABLE MEMORY DEVICES

TECHNICAL FIELD

The invention pertains to methods of forming programmable memory devices, such as, for example, methods of forming erasable programmable read-only memory (EPROM) devices; electrically erasable programmable read-only (EEPROM) devices; and flash memory devices.

BACKGROUND OF THE INVENTION

Programmable read-only memory devices have numerous applications in modern semiconductor structures. Among the devices which can be particularly useful are EPROM and EEPROM devices, which can store information in read-only format and yet enable the information stored therein to be erased by subjecting the memory devices to appropriate energy. The energy utilized to erase EPROM devices is typically ultraviolet (UV) radiation, whereas the energy utilized to erase EEPROM devices is electrical energy. A flash device is typically an EEPROM device, with the term "flash" indicating that the device can be erased within a time of less than or equal to 2 seconds.

It is desired to develop improved methods for forming programmable read-only memory devices.

SUMMARY OF THE INVENTION

In one aspect, the invention includes a method of forming a programmable memory device. A tunnel oxide is formed to be supported by a semiconductor substrate. A stack is formed over the tunnel oxide. The stack comprises a floating gate, dielectric mass and control gate. The stack has a top, and has opposing sidewalls extending downwardly from the top. The dielectric mass includes silicon nitride. Silicon nitride spacers are formed along sidewalls of the stack, and a silicon nitride cap is formed over a top of the stack. The silicon nitride within the dielectric mass, cap and/or sidewall spacers is formed from trichlorosilane and ammonia.

BRIEF DESCRIPTION OF THE DRAWINGS

Preferred embodiments of the invention are described below with reference to the following accompanying drawings.

FIG. 4 is a view of the FIG. 1 fragment shown at a processing stage subsequent to that of FIG. 3.

FIG. 5 is a diagrammatic, cross-sectional view of an exemplary apparatus which can be utilized for forming silicon nitride materials in accordance with various aspects of the present invention.

DETAILED DESCRIPTION OF THE PREFERRED EMBODIMENTS

Figure 1:
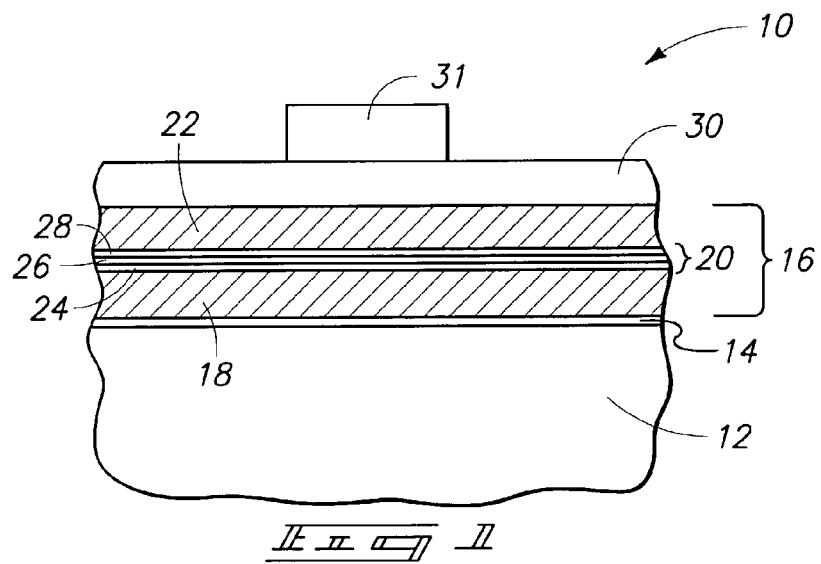
FIG. 1 is a diagrammatic, cross-sectional view of a semiconductor wafer fragment at a preliminary processing step of an exemplary aspect of the present invention.

Exemplary aspects of the invention are described with reference to FIGS. 1-5. Referring initial to FIG. 1, a construction 10 is illustrated at a preliminary stage of an exemplary process. Construction 10 can correspond to, for example, a fragment of a semiconductor wafer assembly. Construction 10 comprises a substrate 12. Substrate 12 can comprise, consist essentially of, or consist of monocrystalline silicon lightly doped with a background dopant (such as, for example, a background p-type dopant). To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A tunnel oxide layer 14 is formed over substrate 12. An exemplary oxide that can be utilized in layer 14 is silicon dioxide. In particular embodiments, tunnel oxide layer 14 can comprise, consist essentially of, or consist of silicon dioxide.

A stack 16 is formed over tunnel oxide layer 14. Stack 16 comprises a floating gate layer 18, a dielectric mass 20, and a control gate layer 22. Floating gate layer 18 and control gate layer 22 can comprise, consist essentially of, or consist of various conductive materials, including, for example, conductively-doped silicon. The conductively-doped silicon can be in the form of, for example, one or both of amorphous silicon and polycrystalline silicon. In particular aspects, control gate layer 22 and floating gate layer 18 can comprise the same compositions as one another, and in other aspects control gate layer 22 and floating gate layer 18 can comprise different compositions from one another. If one or both of floating gate layer 18 and control gate layer 22 comprises conductively-doped silicon, the dopant can be either n-type dopant or p-type dopant.

Dielectric mass 20 is shown comprising three discrete layers, with the layers being labeled as 24, 26 and 28. Layers 24, 26 and 28 can correspond to silicon dioxide, silicon nitride and silicon dioxide, respectively, and the mass 20 can be referred to as an ONO construction. It is to be understood, however, that dielectric mass 20 can comprise other constructions (not shown). For example, dielectric mass 20 can comprise a single homogenous layer, with such layer corresponding to silicon dioxide, silicon nitride, or other insulative materials.

An electrically insulative material 30 is formed over control gate layer 22, and such electrically insulative material can comprise, consist essentially of, or consist of, for example, silicon nitride. The electrically insulative material 30 can be formed in physical contact with the conductive material of control gate 22.

A patterned mask 31 is formed over dielectric material 30. Mask 31 can comprise, for example, photoresist, and can be patterned into the shown shape utilizing photolithographic processing.

Figure 2:
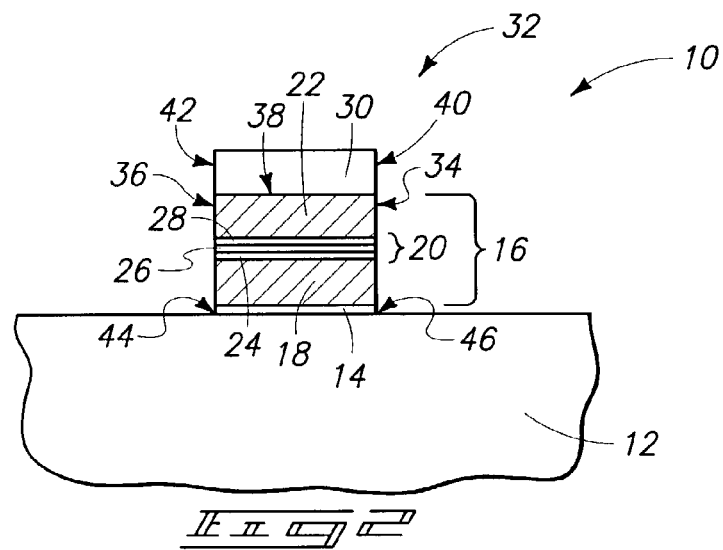
FIG. 2 is a view of the FIG. 1 fragment shown at a processing stage subsequent to that of FIG. 1.

Referring to FIG. 2, a pattern from mask 31 (FIG. 1) is transferred to the underlying materials 14, 18, 24, 26, 28, 22 and 30; and subsequently mask 31 is removed. The patterning of materials 14, 18, 24, 26, 28, 22 and 30 forms such materials into a block 32 over substrate 12. The stack 16 within block 32 can be considered to comprise sidewalls 34 and 36. Additionally, stack 16 can be considered to comprise a top surface 38 over which insulative material 30 is formed. Sidewalls 34 and 36 can be considered opposing sidewalls (or opposing sidewall surfaces) extending downwardly from top surface 38. Insulative material 30 can be considered a cap formed over top surface 38 of stack 16, and in the shown embodiment has sidewalls 40 and 42 which are coextensive with the sidewalls of stack 16. The shown embodiment also illustrates tunnel oxide 14 having sidewalls (illustrated as sidewalls 44 and 46) which are co-extensive with sidewalls of stack 16.

Figure 3:
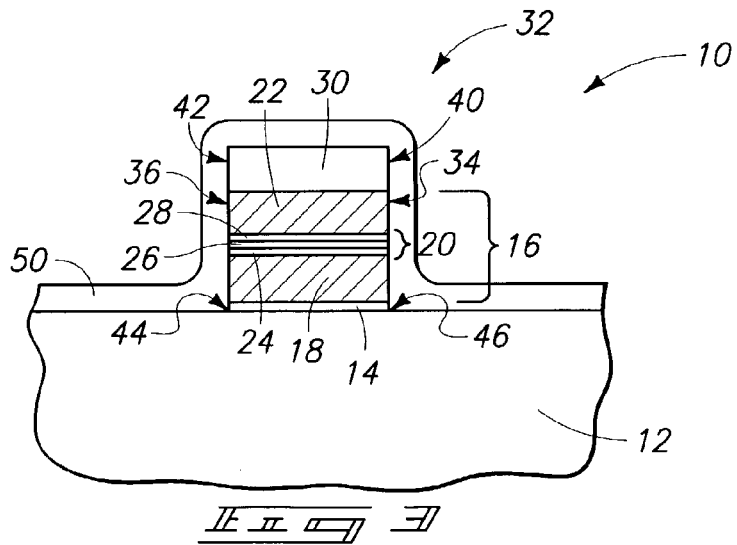
FIG. 3 is a view of the FIG. 1 fragment shown at a processing stage subsequent to that of FIG. 2.

Referring to FIG. 3, an electrically insulative material 50 is formed over block 32 and along the sidewalls of stack 16, tunnel oxide 14 and cap 30. Material 50 can comprise, consist essentially of, or consist of silicon nitride. In the shown aspect of the invention, material 50 is simultaneously formed along sidewalls of tunnel oxide 14 and the cap of material 30 as the material 50 is formed along the sidewalls of stack 16.

Referring to FIG. 4, material 50 is subjected to anisotropic etching to form the material into sidewall spacers 52 and 54 along the opposing sidewalls 34 and 36 of stack 16, as well as along the opposing sidewalls of tunnel oxide 14 and the cap of material 30. FIG. 4 also illustrates source/drain regions 60 and 62 formed within substrate 12 proximate floating gate layer 28. The construction of FIG. 4 can correspond to a programmable read-only memory device, such as an EPROM device, an EEPROM device, or a flash memory device.

The source/drain regions 60 and 62 can be formed after formation of sidewall spacers 52 and 54 utilizing an appropriate angled implant. Alternatively, some or all of the implanting utilized to form source/drain regions 60 and 62 can occur at other processing steps. For example, some or all of the implanting utilized to form the source/drain regions can occur at the processing step of FIG. 2. Specifically, the implanting can occur after formation of the patterned block 32 and utilizing patterned block 32 to align the source/drain regions.

An aspect of the invention is a recognition that the functionality of tunnel oxide 14 can be compromised if hydrogen diffuses into the tunnel oxide. Such aspect can further include a recognition that if one or more of dielectric mass 20, material 30 or the material 50 of sidewall spacers 52 and 54 comprises silicon nitride, it would be desirable if such silicon nitride were formed to have no detectable hydrogen therein. Preclusion of hydrogen from material 30, material 50 and one or more portions of mass 20 (such as a layer 26) can remove potential sources of hydrogen that could otherwise diffuse into tunnel oxide 14. Although hydrogen can potentially diffuse from nitride in any of the materials 50, 30 or 26 to the tunnel oxide 14; material 50 can be particularly problematic in that it actually physically contacts tunnel oxide 14 in the shown construction of FIG. 4.

In typical conventional processing, silicon nitride of materials 26, 30 and 50 would be formed using dichlorosilane (DCS) and ammonia. The films formed utilizing DCS typically have at least $10^{21}$ atoms/cm$^3$ of hydrogen therein. An aspect of the present invention is a recognition that there can be a significant advantage to utilizing trichlorosilane (TCS) and ammonia for forming one or more of materials 26, 30 and 50. Specifically, it is found that TCS and ammonia can form a silicon nitride material from which there is a reduced likelihood of hydrogen migration relative to a silicon nitride material formed from DCS. In particular applications, TCS and ammonia can be utilized to form a silicon nitride material having substantially no desorbable hydrogen therein (with the term "substantially no desorbable hydrogen" indicating that if any desorbable hydrogen is present, the amount is below detection limits). The reduction in desorbable hydrogen may be due to elimination, or substantial elimination, of Si—H (i.e., Si directly bonded to hydrogen) in silicon nitride materials formed from TCS and ammonia.

If silicon nitride is utilized in spacers 52 and 54, cap 30 and/or dielectric mass 20, it can be preferred that such silicon nitride be formed from TCS and ammonia, rather than from DCS and ammonia, due to the reduction in desorbable hydrogen that can be accomplished utilizing TCS and ammonia.

Methodology for forming silicon nitride from TCS and ammonia is described with reference to FIG. 5. Specifically, an apparatus 100 is illustrated. Apparatus 100 comprises a vessel 102 having a reaction chamber 104 provided therein. An inlet port 106 and an outlet port 108 are provided within vessel 102 to allow flow of materials through chamber 104. A substrate holder 110 is illustrated within chamber 104, and a substrate 112 is shown supported by holder 110. Substrate 112 can correspond to, for example, a semiconductor wafer construction, and can correspond to the construction 10 at various processing steps utilized in the sequence described previously with reference to FIGS. 1-4.

In operation, precursors are flowed into chamber 104 through inlet port 106 (with the precursors illustrated diagrammatically by an arrow 120), and materials are exhausted from reaction chamber 104 through outlet port 108 (with the exhausted materials being illustrated diagrammatically by arrow 122). The precursors preferably comprise, consist essentially of, or consist of, trichlorosilane and ammonia; and are utilized for forming silicon nitride materials over substrate 112 (with exemplary silicon nitride materials being one or more of the materials 26, 30 and 50 described above with reference to FIGS. 1-4). In particular aspects of the invention, the primary source of silicon in one or more of the silicon nitride materials formed over substrate 112 is trichlorosilane (i.e, the precursor of at least 50% of the silicon in the silicon nitride is trichlorosilane); and in some of the aspects the sole precursor of silicon in one or more of the silicon nitride materials is trichlorosilane.

An inert gas can be provided in addition to the precursor materials to aid in flowing the materials through chamber 104. The term "inert" is utilized to indicate that the gas does not react with the precursors or with exposed portions of substrate 112. Suitable inert gases can include, for example, nitrogen (N$_2$) and argon.

The TCS and ammonia precursors react to deposit silicon nitride over exposed surfaces of substrate 112. The deposition can occur at relatively low pressures, and accordingly can correspond to low pressure chemical vapor deposition (LPCVD). The deposition can be enhanced with a plasma (not shown) provided within chamber 104. Exemplary conditions for forming a silicon nitride material from TCS and ammonia include a pressure within chamber 104 of from about 500 mTorr to about 1 Torr, a temperature of an exposed surface of substrate 112 of from about 500° C. to about 750° C., a flow rate of TCS of from about 20 standard cubic centimeters per minute (sccm) to about 200 sccm, and a flow rate of ammonia of from about 250 sccm to about 1000 sccm.

The TCS and ammonia can be utilized to form a silicon nitride deposit which substantially no Si—H (i.e., has substantially no hydrogen bonded to silicon). The term "substantially no Si—H "refers to a Si—H concentration of less than or equal to $1\times10^{19}$ cm$^{-3}$. The TCS and ammonia preferably form a silicon nitride having no detectable Si—H therein.

Programmable read-only memory devices formed utilizing TCS and ammonia as the precursors of silicon nitride components associated with the devices are found to have better data retention than memory devices formed utilizing DCS and ammonia as precursors of the silicon nitride utilized in the components.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a programmable memory device, comprising:
   providing a semiconductor substrate;
   forming a stack over the substrate; the stack comprising a tunnel oxide, floating gate, dielectric mass and control gate; the stack having a top and having opposing sidewalls extending downwardly from the top, the control gate comprising the top of the stack;
   depositing silicon nitride along the sidewalls of the stack and directly against the tunnel oxide, the silicon nitride being formed from precursors comprising trichlorosilane and ammonia wherein the trichlorosilane and ammonia are reacted to deposit the silicon nitride over the stack and over exposed surfaces of the semiconductor substrate; and wherein the primary source of silicon for the deposited silicon nitride is the trichlorosilane;
   forming a silicon nitride layer over and directly against the control gate at the top of the stack;
   wherein the control gate comprises a first composition of material, and wherein the floating gate comprises a second composition of material, and wherein the first composition is different from the second composition;
   wherein at least one of the control gate and the floating gate comprises at least amorphous silicon;
   wherein the depositing of the silicon nitride comprises providing precursors within a reaction chamber to form the silicon nitride; and wherein the precursors provided within the chamber to form the silicon nitride consist of trichlorosilane and ammonia; and
   wherein the providing of the precursors comprises exposing the precursors to plasma during formation of the silicon nitride.

2. The method of claim 1 wherein the depositing of the silicon nitride comprises providing the silicon nitride having substantially no Si—H therein.

3. The method of claim 1 wherein the depositing of the silicon nitride comprises providing the silicon nitride having no detectable Si—H therein.

4. The method of claim 1 wherein the depositing of the silicon nitride comprises providing the silicon nitride along the sidewalls, and further comprising anisotropically etching the silicon nitride along the sidewalls to form spacers along the sidewalls of the stack.

5. The method of claim 1 wherein the depositing of the silicon nitride comprises providing an inert gas within the chamber in addition to the precursors.

6. The method of claim 1 wherein the dielectric mass comprises silicon nitride; and wherein the silicon nitride of the dielectric mass is formed from trichlorosilane and ammonia.

7. The method of claim 1 wherein the forming of the silicon nitride layer comprises forming a cap over the top of the stack; and wherein the silicon nitride layer is formed from trichlorosilane and ammonia.

8. The method of claim 1 wherein the dielectric mass comprises silicon nitride; wherein the silicon nitride of the dielectric mass is formed from trichlorosilane and ammonia; and wherein the forming of the silicon nitride layer comprises forming a cap over the top of the stack; and wherein the silicon nitride layer is formed from trichlorosilane and ammonia.

9. The method of claim 1 wherein the memory device is an EPROM (erasable programmable read-only memory) device.

10. The method of claim 1 wherein the memory device is an EEPROM (electrically erasable programmable read-only memory) device.

11. The method of claim 1 wherein the memory device is a flash memory device.

12. The method of claim 1 wherein the control gate comprises amorphous silicon.

13. The method of claim 1 wherein the dielectric mass comprises a single homogenous layer.

14. The method of claim 1 wherein the dielectric mass comprises an insulative material other than silicon dioxide and silicon nitride.

15. The method of claim 1 wherein the floating gate comprises amorphous silicon.

16. The method of claim 1 wherein the forming of the silicon nitride layer comprises forming the silicon nitride layer from precursors comprising trichlorosilane and ammonia.

17. The method of claim 1 wherein during the depositing, providing the exposed surfaces of the semiconductor substrate at a temperature comprising from about 500° C. to about 750° C.

18. The method of claim 1 wherein during the depositing, providing the trichlorosilane at a flow rate comprising from about 20 sccm to about 200 sccm.

19. The method of claim 1 wherein the control gate is devoid of silicide material.

20. The method of claim 1 wherein each of the control gate and the floating gate comprises conductively-doped silicon, and wherein one of the control gate and the floating gate comprises n-type dopant and the other of the control gate and the floating gate comprises p-type dopant.

21. The method of claim 1 wherein at least one of the control gate and the floating gate comprises a combination of amorphous silicon and polycrystalline silicon.

22. The method of claim 1 wherein only one of the control gate and the floating gate comprises conductively-doped silicon.

23. A method of forming a programmable memory device, comprising:
   providing a semiconductor substrate;
   forming a stack over the substrate; the stack comprising a tunnel oxide, floating gate, dielectric mass and control gate; the stack having a top and having opposing sidewalls extending downwardly from the top, the control gate comprising the top of the stack;
   depositing silicon nitride along the sidewalls of the stack and directly against the tunnel oxide, the silicon nitride being formed from precursors comprising trichlorosilane and ammonia wherein the trichlorosilane and ammonia are reacted to deposit the silicon nitride over the stack and over exposed surfaces of the semiconductor substrate; and wherein the primary source of silicon for the deposited silicon nitride is the trichlorosilane;
   forming a silicon nitride layer over and directly against the control gate at the top of the stack;
   wherein the depositing of the silicon nitride comprises providing precursors within a reaction chamber to form the silicon nitride; and wherein the precursors provided within the chamber to form the silicon nitride consist of trichlorosilane and ammonia; and
   wherein the providing of the precursors comprises exposing the precursors to plasma during formation of the silicon nitride.

24. A method of forming a programmable memory device, comprising:

providing a semiconductor substrate;

forming a stack over the substrate; the stack comprising a tunnel oxide, floating gate, dielectric mass and control gate; the stack having a top and having opposing sidewalls extending downwardly from the top, the control gate comprising the top of the stack;

depositing silicon nitride along the sidewalls of the stack and directly against the tunnel oxide, the silicon nitride being formed from precursors comprising trichlorosilane and ammonia wherein the trichlorosilane and ammonia are reacted to deposit the silicon nitride over the stack and over exposed surfaces of the semiconductor substrate; and wherein the primary source of silicon for the deposited silicon nitride is the trichlorosilane;

forming a silicon nitride layer over and directly against the control gate at the top of the stack;

wherein the control gate comprises a first composition of material, and wherein the floating gate comprises a second composition of material, and wherein the first composition is different from the second composition;

wherein the depositing of the silicon nitride comprises providing precursors within a reaction chamber to form the silicon nitride; and wherein the precursors provided within the chamber to form the silicon nitride consist of trichlorosilane and ammonia; and wherein the providing of the precursors comprises exposing the precursors to plasma during formation of the silicon nitride.

* * * * *

UNITED STATES PATENT AND TRADEMARK OFFICE
CERTIFICATE OF CORRECTION

PATENT NO. : 7,651,910 B2 Page 1 of 1
APPLICATION NO. : 10/150623
DATED : January 26, 2010
INVENTOR(S) : Beaman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 568 days.

Signed and Sealed this

Twenty-third Day of November, 2010

David J. Kappos
*Director of the United States Patent and Trademark Office*